DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED MAY 1, 1973

910 O.G. 7

T910,005

RADIATION SENSITIVE POLYACETYLENIC COMPOSITIONS FOR FLOURESCENT IMAGES

Arthur A. Rasch, Webster, and Wilbur C. Hodges, Rochester, N.Y. (both of Kodak Park, Rochester, N.Y. 14650)

Filed Nov. 9, 1972, Ser. No. 305,200
Int. Cl. G03c *5/04*
U.S. Cl. 96—48
No Drawing. 19 Pages Specification

Films prepared from specific polyacetylenic compositions may be exposed to electron beam or short wave ultraviolet radiation, resulting in colorless or low contrast image formation in the exposed areas. When these materials are subsequently subjected to overall ultraviolet radiation of longer wavelength, fluorescent images appear in exposed areas. Such images may be utilized for electronic readout, image amplification, or photocopying.